(12) United States Patent
Nien

(10) Patent No.: US 9,413,347 B1
(45) Date of Patent: Aug. 9, 2016

(54) DUTY CYCLE CORRECTION APPARATUS

(71) Applicant: ELITE SEMICONDUCTOR MEMORY TECHNOLOGY INC., Hsinchu (TW)

(72) Inventor: Shu-Han Nien, Changhua County (TW)

(73) Assignee: ELITE SEMICONDUCTOR MEMORY TECHNOLOGY INC., Hsinchu (TW)

( * ) Notice: Subject to any disclaimer, the term of this patent is extended or adjusted under 35 U.S.C. 154(b) by 0 days.

(21) Appl. No.: 14/955,488

(22) Filed: Dec. 1, 2015

(51) Int. Cl.
*H03K 3/017* (2006.01)
*H03K 7/08* (2006.01)

(52) U.S. Cl.
CPC .......................................... *H03K 7/08* (2013.01)

(58) Field of Classification Search
CPC ..... H03K 5/1565; H03K 3/017; H03K 3/284; H03K 7/08
USPC ................. 327/175, 170, 172–174, 156–163; 375/373–376
See application file for complete search history.

(56) References Cited

U.S. PATENT DOCUMENTS

| | | | | |
|---|---|---|---|---|
| 7,629,820 B2* | 12/2009 | Heyne | ....................... | G11C 7/22 327/149 |
| 8,106,697 B2* | 1/2012 | Chang | .................. | H03K 5/1565 327/172 |
| 8,207,771 B2* | 6/2012 | Koo | ...................... | H03K 5/1565 327/173 |
| 8,773,186 B1* | 7/2014 | Liou | ..................... | H03K 5/1565 327/172 |
| 2003/0204767 A1* | 10/2003 | Ishida | ................... | H03K 5/1565 713/503 |
| 2009/0128206 A1* | 5/2009 | Boerstler | .............. | H03L 7/0995 327/175 |
| 2011/0248752 A1* | 10/2011 | Willey | ................. | H03K 5/1565 327/117 |
| 2013/0028029 A1* | 1/2013 | Huang | ................... | G11C 7/222 365/189.07 |
| 2014/0118045 A1* | 5/2014 | Lee | ......................... | H03K 3/017 327/175 |

* cited by examiner

*Primary Examiner* — Lincoln Donovan
*Assistant Examiner* — Thomas Skibinski
(74) *Attorney, Agent, or Firm* — Li&Cai Intellectual Property (USA) Office (57) ABSTRACT

An exemplary embodiment of the present disclosure illustrates a duty cycle correction apparatus for fast adjusting internal clocks to have specific duty cycles. Firstly, a reference clock is adjusted to have one specific duty cycle in response to analog feedback clocks. Then, by using a phase detector, phases of the reference clock and one internal clock are compared to generate a phase detection signal. Next, by using a digital-analog converter, complementary signals are generated according to a phase detection signal received by the counter, and the signals are used to adjust the duty cycles of the internal clocks. When the complementary signals make the duty cycle of the internal clock equals to the specific duty cycle, codes of the complementary signals are recorded.

9 Claims, 6 Drawing Sheets

DUTY CYCLE CORRECTION APPARATUS

BACKGROUND

1. Technical Field

The present disclosure relates to a duty cycle correction apparatus, and in particular, to the duty cycle correction apparatus capable of fast adjusting the internal clocks to have the specific duty cycles.

2. Description of Related Art

The duty cycle correction apparatus is used to correct or adjust duty cycles of complementary internal clocks in the electronic apparatus, such that the duty cycles are not less or larger than the required duty cycle, and the external noise disturbance is avoided. The conventional duty cycle correction apparatus can use the analog signals and digital signals to adjust the duty cycles of the internal clocks in the electronic apparatus. The manner which the analog signals are used to adjust the duty cycles of the internal clocks has the fast adjusting speed, but cannot be applied in the power saving mode (the analog signals will be disappeared). In addition, the manner which the digital signals are used to adjust the duty cycles of the internal clocks can be applied in the power saving mode (the digital signals can be recorded), but has the slow adjusting speed.

Figure 1:
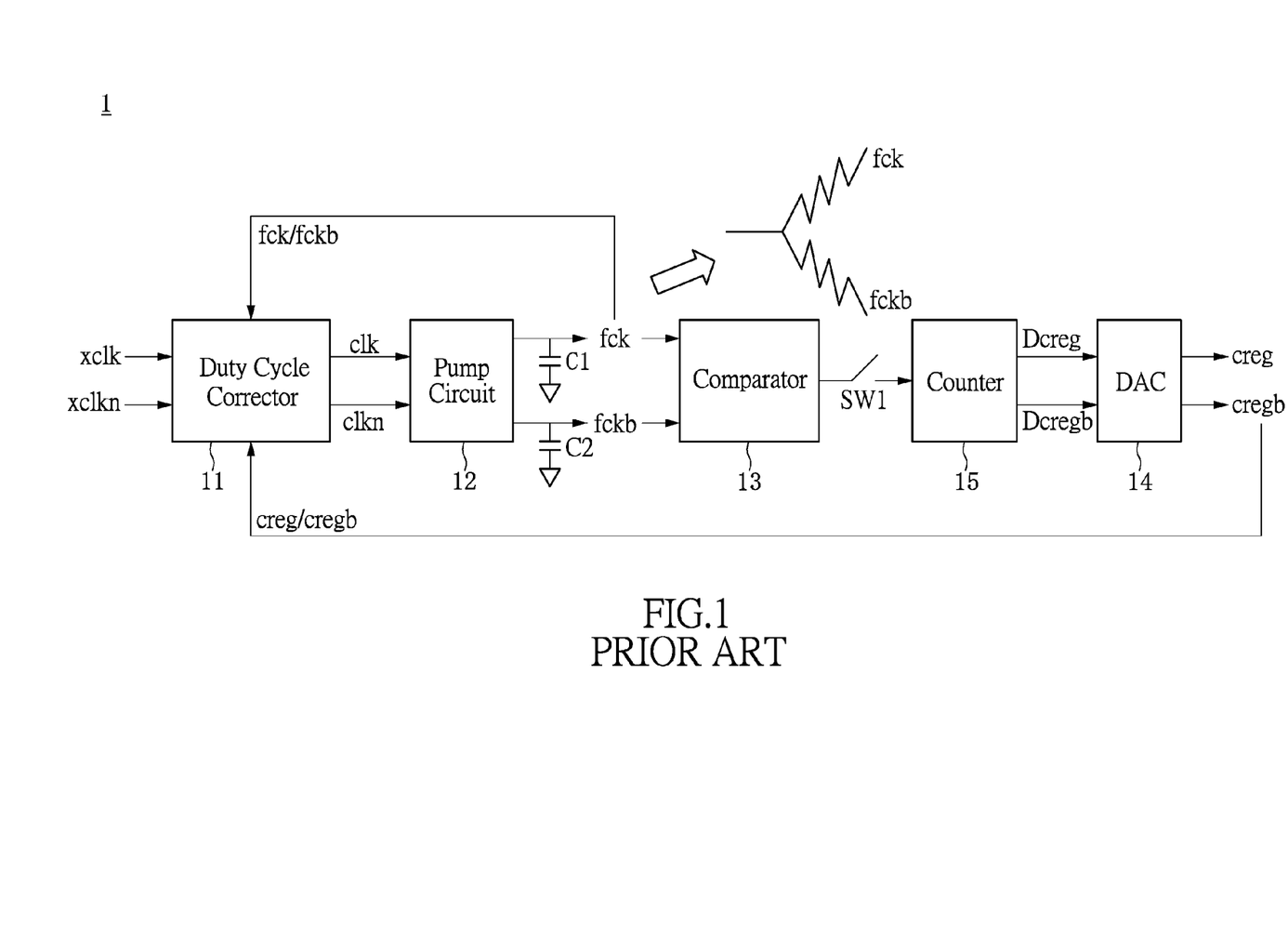
FIG. 1 is a schematic diagram of a conventional duty cycle correction apparatus.

Referring to FIG. 1, FIG. 1 is a schematic diagram of a conventional duty cycle correction apparatus. The conventional duty cycle correction apparatus comprises a duty cycle corrector 11, a pump circuit 12, capacitors C1, C2, a comparator 13, a switch SW1, a counter 15 and a digital-analog converter (DAC) 14, wherein the duty cycle corrector 11 is electrically connected to the pump circuit 12, the pump circuit 12 is electrically connected to the comparator 13 and the duty cycle corrector 11, two ends of the capacitor C1 are respectively electrically connected to the pump circuit 12 and a grounding end, two ends of the capacitor C2 are respectively electrically connected to the pump circuit 12 and the grounding end, the comparator 13 is electrically connected to the counter 15 via the switch SW1, the counter 15 is electrically connected to the digital-analog converter 14 and the digital-analog converter 14 is electrically connected to the duty cycle corrector 11.

The duty cycle corrector 11 receives complementary external clocks xclk and xclkn, and generates complementary internal clocks clk and clkn according to the external clocks xclk and xclkn. Next, the pump circuit 12 receives the internal clocks clk and clkn, and generates the complementary feedback clocks fck and fckb according to the internal clocks clk and clkn, wherein since two output ends of the pump circuit 12 are electrically connected to the grounding end respectively via the two capacitors C1 and C2, the feedback clocks fck and fckb are analog integration signals of the internal clocks clk and clkn. The feedback clocks fck and fckb are feedbacked to the duty cycle corrector 11 to fast adjust the internal clocks clk and clkn. It is noted that, in the power saving mode, the feedback clocks fck and fckb leakage via the capacitors C1 and C2 respectively, such that the feedback clocks fck and fckb will be disappeared.

After the feedback clocks fck and fckb are used to fast adjust the internal clocks clk and clkn, the switch SW1 is turned on. Next, the comparator 13 compares the feedback clocks fck and fckb, and generates a comparison signal to the counter 15. The counter 15 generates complementary digital signals Dcreg and Dcregb according to the comparison signal. The digital-analog converter 14 generates complementary signals creg and cregb according to the complementary digital signals Dcreg and Dcregb, and feedbacks the signals creg and cregb to the duty cycle corrector 11 to adjust the internal clocks clk and clkn. It is noted that, after the duty cycles of the internal clocks clk and clkn are adjusted to equal to the required duty cycles, codes of the signals creg and cregb are recorded to be utilized in the next adjustment. Each time the comparator 13 performs comparison, the comparator 13 starts to perform comparison while the amplitude deviation between the feedback clocks fck and fckb reaches a specific value, and thus the adjusting speed is slow.

Figure 2:
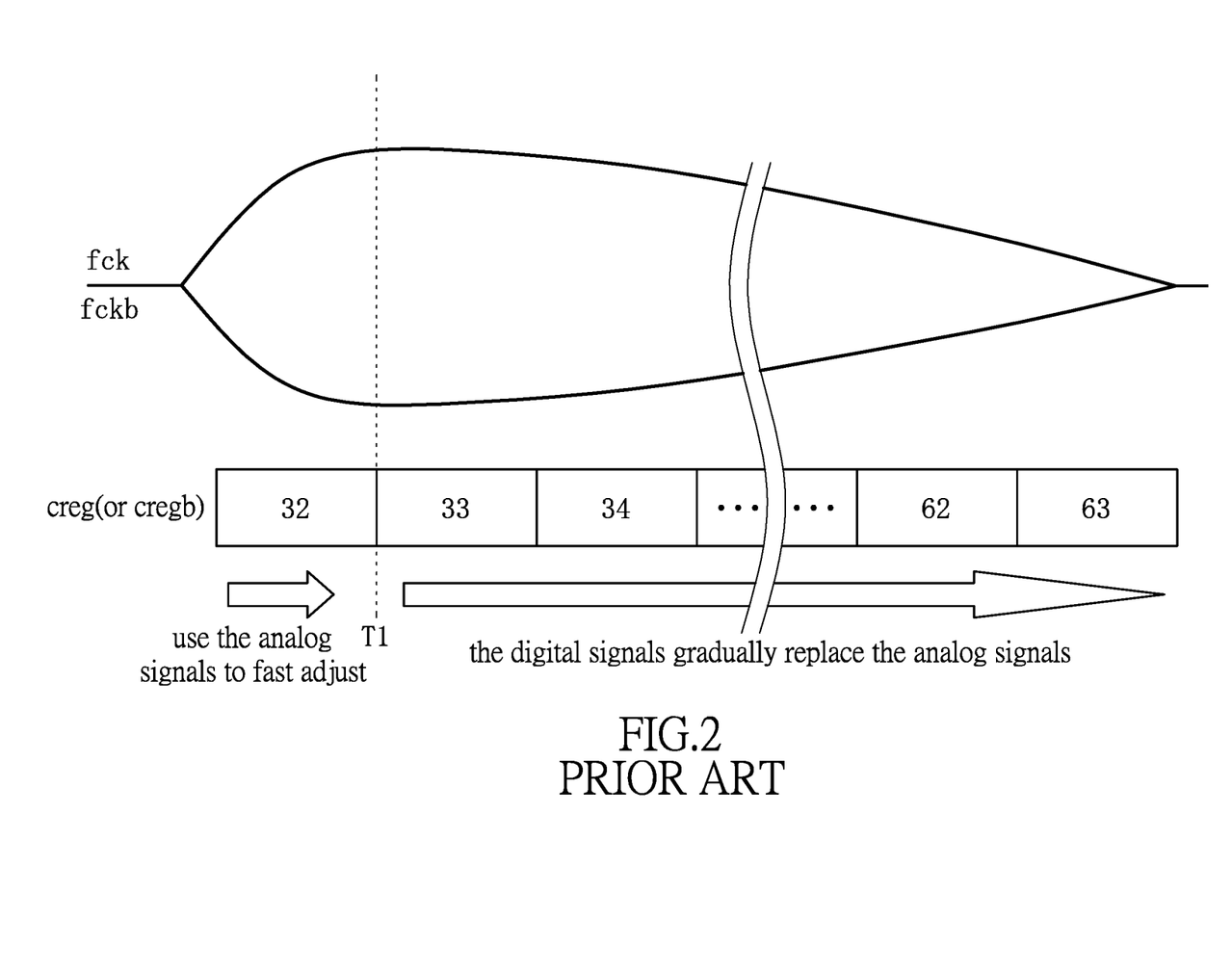
FIG. 2 is a schematic diagram which the conventional duty cycle correction apparatus adjusts the duty cycles of the internal clocks to equal to the required duty cycles.

Referring to FIG. 1 and FIG. 2, FIG. 2 is a schematic diagram which the conventional duty cycle correction apparatus adjusts the duty cycles of the internal clocks to equal to the required duty cycles. Firstly, before time T1, the conventional duty cycle correction apparatus 1 uses the feedback clocks fck and fckb to fast adjust the duty cycles of the internal clocks clk and clkn, and next, the switch SW1 is turned on to be conductive, such that the signal creg (or cregb) with the digital code being 32 and its complementary signal cregb (or creg) are obtained. After time T1, the sequentially feedbacked signals creg and cregb are used to gradually replace the analog signals (i.e. feedback clocks fck and fckb) to adjust the duty cycles of the internal clocks clk and clkn to equal to the required duty cycles. As shown in FIG. 2, the signal creg (or cregb) with the code being 33 and its complementary signal cregb (or creg) are firstly used to adjust the duty cycle of the internal clocks clk and clkn. The example in FIG. 2 is a worst case, the duty cycles of the internal clocks clk and clkn are adjusted to equal to the required duty cycles until the signal creg (or cregb) with the digital code being 63 and its complementary signal cregb (or creg) are used to adjust the duty cycles of the internal clocks clk and clkn.

Assuming double data rate 1 synchronous dynamic random access memory (DDR1 SDRAM) is used to access the signals creg and cregb, each consuming time that the signals creg and cregb are used to adjust the internal clocks clk and clkn is about 32 system clocks (tcks), and thus in the condition of FIG. 2, it cost 31*32=992 system clocks (992 tcks) to obtain the digital codes which make the duty cycle of the internal clocks clk and clkn equal to the required duty cycles.

Figure 3:
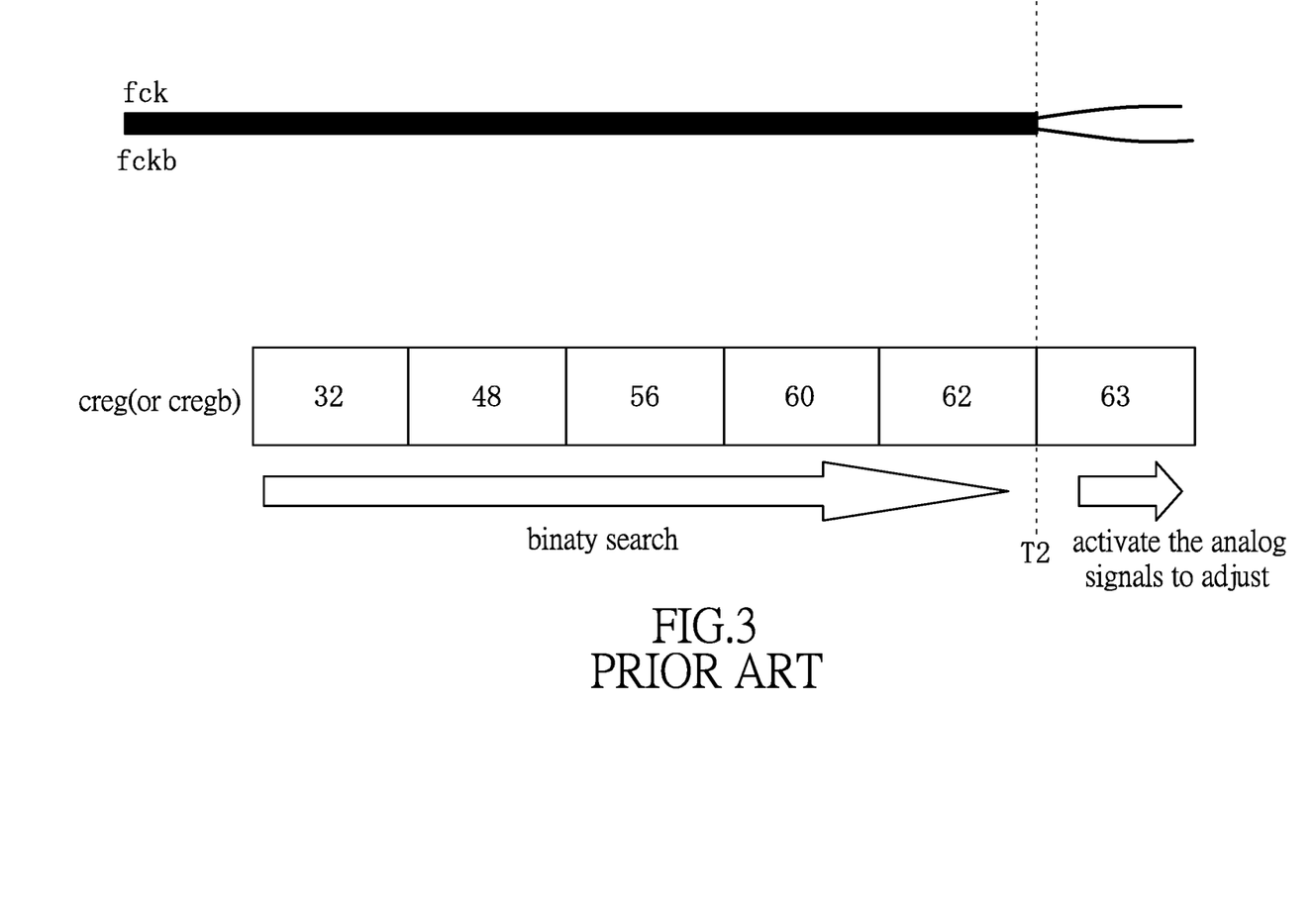
FIG. 3 is one other schematic diagram which the conventional duty cycle correction apparatus adjusts the duty cycles of the internal clocks to equal to the required duty cycles.

Referring to FIG. 1 and FIG. 3, FIG. 3 is one other schematic diagram which the conventional duty cycle correction apparatus adjusts the duty cycles of the internal clocks to equal to the required duty cycles. Being different from FIG. 2, in the example of FIG. 3, the switch SW1 is firstly turned on to be conductive, and the signal creg (or cregb) with the digital code being 32 and it complementary signal cregb (or creg) are used to adjust the duty cycles of the internal clocks clk and clkn. Then, by the help of the binary search, the signals creg (or cregb) with the digital codes being 48, 56, 60, and 62 and their complementary signals cregb (or creg) are used to sequentially adjust the duty cycles of the internal clocks clk and clkn. The example of FIG. 3 is a worst case, the duty cycles of the internal clocks clk and clkn are adjusted to equal to the required duty cycles until the signal creg (or cregb) with the digital code being 63 and its complementary signal cregb (or creg) are used to adjust the duty cycles of the internal clocks clk and clkn. Next, after time T2, the feedback clocks fck and fckb are activated to fast adjust the duty cycles of the internal clocks clk and clkn.

Assuming double data rate 1 synchronous dynamic random access memory (DDR1 SDRAM) is used to access the signals creg and cregb, each consuming time that the signals creg and cregb are used to adjust the internal clocks clk and clkn is about 32 system clocks (tcks), and thus in the condition of FIG. 3, it cost 5*32=160 system clocks (160 tcks) to obtain the digital codes which make the duty cycles of the internal clocks clk and clkn equal to the required duty cycles.

As the above descriptions, the consuming time which the conventional duty cycle correction apparatus finds the digital codes corresponding to the required duty cycle is long, and the consuming time may be reduced by other manners.

SUMMARY

An exemplary embodiment of present disclosure provides a duty cycle correction apparatus comprising a first duty cycle corrector, a pump circuit, a phase detection apparatus, and a digital-analog converter. The first duty cycle corrector receives complementary external clocks to generate complementary first internal clocks. The pump circuit electrically connected to the first duty cycle corrector receives the first internal clocks to generate complementary feedback clocks to the first duty cycle corrector to adjust duty cycles of the first internal clocks. The phase detection apparatus electrically connected to the first duty cycle corrector is activated while the duty cycle of the first internal clock is adjusted to a specific duty cycle, for receiving the external clocks to generate complementary second internal clocks, selecting the first internal clock as a reference clock, and comparing phases of the second internal clock and the reference clock to generate a phase detection signal. The digital-analog converter electrically connected to the counter generates complementary signals to the phase detection apparatus to adjust duty cycles of the second internal clocks according to the phase detection signal. The duty cycle correction apparatus records codes of the signals which make the duty cycle of the second internal clock equal to the specific duty cycle, and after the codes are recorded, the phase detection apparatus is inactivated.

To sum up, the exemplary embodiment of the present disclosure provides a duty cycle correction apparatus capable of fast adjusting the internal clocks to have the specific duty cycles.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings provide a further understanding to the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Reference will now be made in detail to the exemplary embodiments of the present disclosure, examples of which are illustrated in the accompanying drawings. Wherever possible, the same reference numbers are used in the drawings and the description to refer to the same or like parts.

An exemplary embodiment of the present disclosure provides a duty cycle correction apparatus capable of fast adjusting the internal clocks to have the specific duty cycles. The duty cycle correction apparatus firstly uses a first duty cycle corrector to adjust duty cycles of complementary first internal clocks to equal to specific duty cycles according to complementary feedback clocks, and select one of the internal clocks as a reference clock. Next, the duty cycle correction apparatus uses a phase detector to compare phases between one of the second internal clocks and the reference clock to generate a phase detection signal to the counter for outputting complementary digital signals to the digital-analog converter.

Next, according to the complementary digital signals outputting from the counter, the digital-analog converter generates complementary signals to the second duty cycle corrector to adjust duty cycles of the second internal clocks. By the corporation of the second duty cycle corrector, the phase detector, and the digital-analog converter, after the signals make the duty cycles of the second internal clocks equal to the duty cycles of the reference clocks, the codes of the signals are recorded. Then, the duty cycle correction apparatus uses the first duty cycle corrector to adjust the duty cycles of the first internal clocks to equal to the specific duty cycles according to the complementary feedback clocks. Next, details of the duty cycle correction apparatus provided by the exemplary embodiment of the present disclosure are illustrated as follows.

Figure 4:
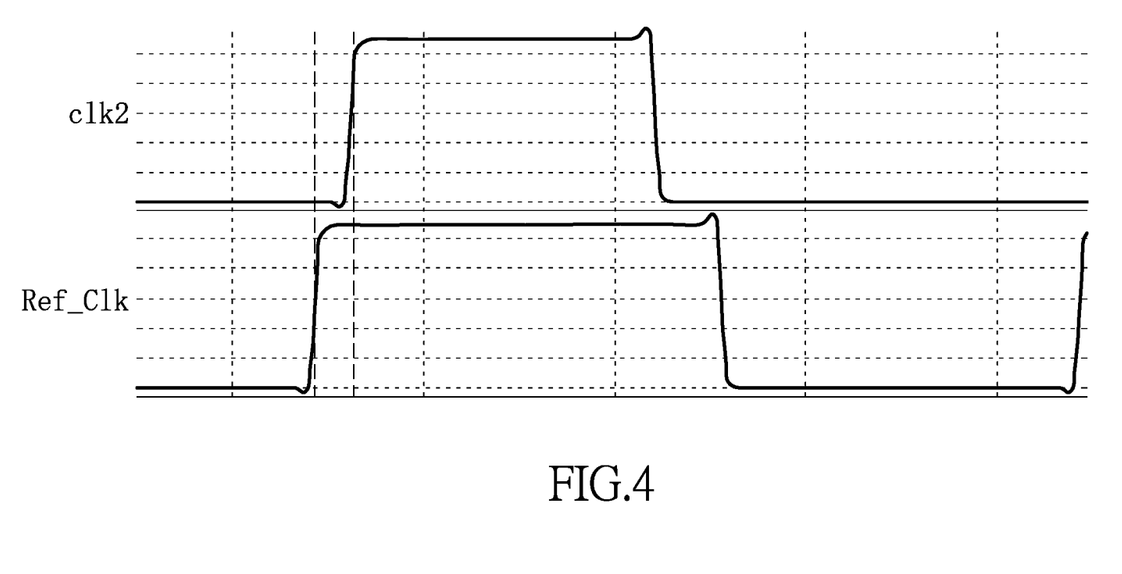
FIG. 4 is a waveform diagram of a second internal clock and a reference clock according to one exemplary embodiment of the present disclosure.

Referring to FIG. 4, FIG. 4 is a waveform diagram of a second internal clock and a reference clock according to one exemplary embodiment of the present disclosure. The manner which the first duty cycle corrector and the second duty cycle corrector adjust the duty cycles of the first internal clocks and the second internal clocks is shift the inner generated waveforms up or down to determine the duty cycles, and the duty cycles relate to rising edge positions (the positions which the voltages rise) of the first internal clocks and the second internal clocks. As shown in FIG. 4, the reference clocks Ref_clk almost has the 50%/50% duty cycle, and the second internal clock clk2 has the 40%/60% duty cycle, thus the rising edge position of the second internal clock clk2 lags behind the rising edge position of the reference clocks Ref_clk, and after the duty cycle of the second internal clock clk2 is adjusted more than 50.1%/49.9%, the rising edge position thereof leads the original rising edge position thereof. By contrast, if the second internal clock clk2 has the 60%/40% duty cycle (not shown in FIG. 4), the rising edge position of the second internal clock clk2 leads the rising edge position of the reference clock Ref_clk, and after the duty cycle of the second internal clock clk2 is adjusted more than 50.1%/49.9%, the rising edge position thereof lags behind the original rising edge position thereof.

Figure 5:
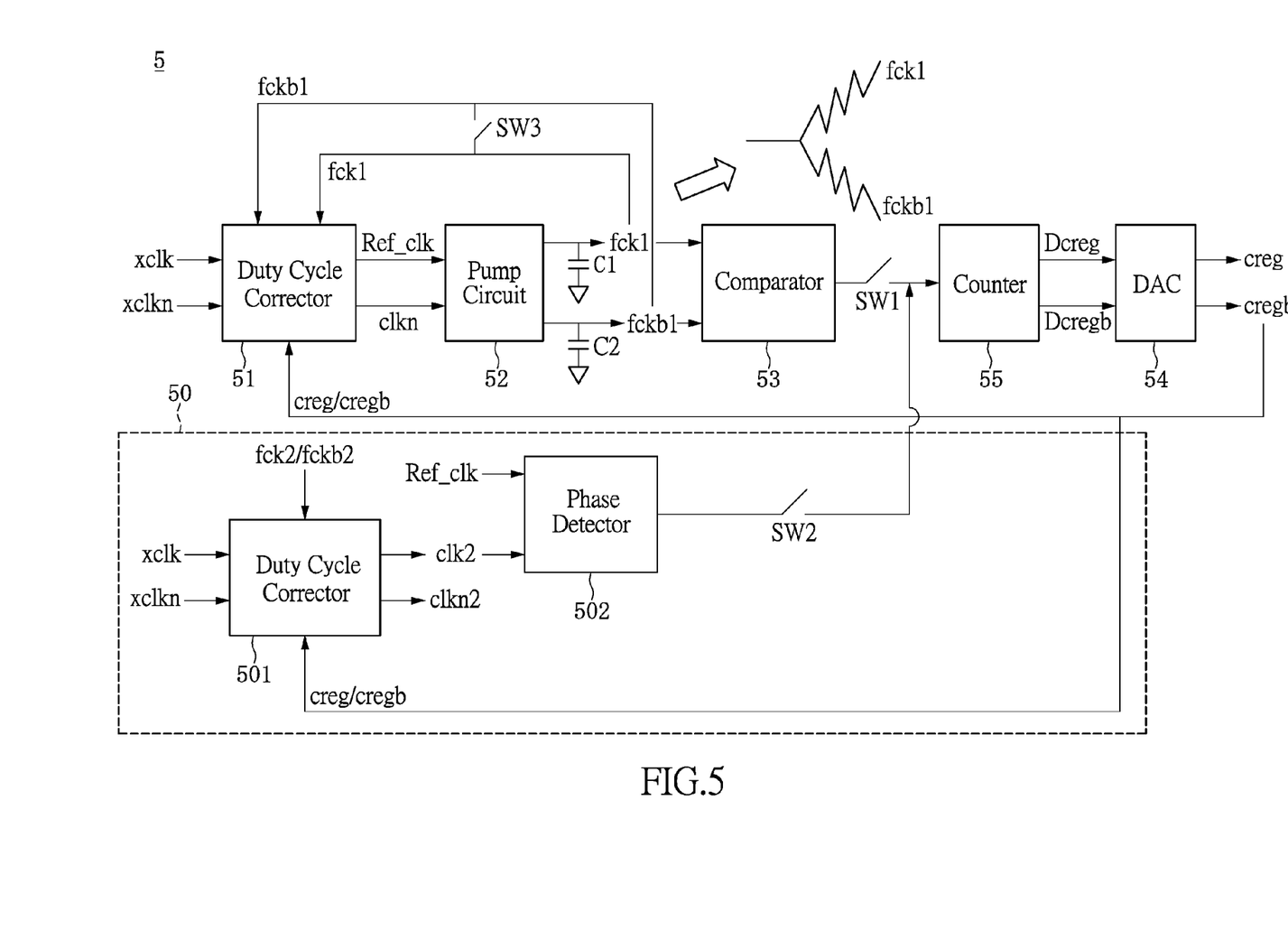
FIG. 5 is a schematic diagram of a duty cycle correction apparatus according to one exemplary embodiment of the present disclosure.

Referring to FIG. 5, FIG. 5 is a schematic diagram of a duty cycle correction apparatus according to one exemplary embodiment of the present disclosure. duty cycle correction apparatus 5 comprises a phase detection apparatus 50, a first duty cycle corrector 51, a pump circuit 52, capacitors C1, C2, a comparator 53, a first switch SW1, a counter 55 and a digital-analog converter 54. Wherein the phase detection apparatus 50 is electrically connected to the counter 55, the digital-analog converter 54 is electrically connected to the counter 55, the first duty cycle corrector 51 is electrically connected to the pump circuit 52, the pump circuit 52 is electrically connected to the comparator 53, the comparator 53 is electrically connected to the counter 55 via the firs switch SW1, the counter 55 is electrically connected to the digital-analog converter 54, the digital-analog converter 54 is electrically connected to the first duty cycle corrector 51 and the phase detection apparatus 50, two ends of the capacitor C1 are respectively electrically connected to the pump circuit 52 and the ground end, and two ends of the capacitor C2 are respectively electrically connected to the pump circuit 52 and the ground end.

Firstly, the first switch SW1 is turned off to be nonconductive, the first duty cycle corrector 51 receives complementary external clocks xclk and xclkn, and according to the external clocks xclk and xclkn, generates complementary first internal clocks Ref_clk and clkn. The pump circuit 52 receives the first internal clock Ref_clk and clkn, and according to the first internal clocks Ref_clk and clkn, generates complementary feedback clocks fck1 and fckb1 (being analog signals). The first duty cycle corrector 51 receives the feedback clocks fck1 and fckb1, and according to the feedback clocks fck1 and fckb1, adjusts the duty cycle of the first internal clocks Ref_clk and clkn. By using the analog feedback clocks fck1 and fckb1, the duty cycle of the first internal clock Ref_clk can be fast adjusted to equal to the specific duty cycle. In the exemplary embodiment, the first internal clock Ref_clk is selected as the reference clock Ref_clk which acts as a phase comparison basis of the phase detection apparatus 50.

After the duty cycle of the first internal clock Ref_clk is adjusted to equal to the specific duty cycle, the phase detection apparatus 50 remains activated. The phase detection apparatus 50 receives the external clocks xclk and xclkn, and generates complementary second internal clocks clk2 and clkn2, and compares the phases of the second internal clock clk2 and the reference clock Ref_clk, so as to generate the phase detection signal.

The counter 55 is used to generate complementary digital signals Dcreg and Dcregb according to the phase detection signal and the digital-analog converter 54 is used to generate complementary signals creg and cregb according to the complementary digital signals Dcreg and Dcregb, and feedback the signals creg and cregb to the phase detection apparatus 50, such that the phase detection apparatus 50 adjusts the duty cycles of the second internal clocks clk2 and clkn2 according to the signals creg and cregb. When the duty cycle of the second internal clock clk2 is adjusted to equal to the duty cycle of the reference clock Ref_clk (i.e. the specific duty cycle), the codes of the feedbacked signals creg and cregb are recorded. Next, the second switch SW2 is turned off, the first switch SW1 is turned on and a third switch SW3 coupled between the feedback clocks fck1 and fckb1 is turned on for equalizing the feedback clocks fck1 and fckb1 in a clock cycle, then the duty cycle corrector 51 can adjust the first internal clocks Ref_clk and clkn according to the feedback clocks fck1 and fckb1 in real time.

In short, the phase detection apparatus 50 can select the first internal clock Ref_clk with the specific duty cycle which the duty cycle corrector 51 adjusts as the reference clock Ref_clk, and after several phase comparisons of the reference clock Ref_clk and the second internal clock clk2, the codes of the signals creg and cregb which make the duty cycle of the second internal clock clk2 equal to the specific duty cycle can be found. Since the phase detection apparatus 50 perform the phase comparison, i.e. comparison of the rising edge positions of the reference clock Ref_clk and the second internal clock clk2, not like the conventional duty cycle correction apparatus (in FIG. 1, the comparator 13 generates the comparison signal to the counter 15, and the digital-analog converter 14 generates the signals creg and cregb, while the amplitude deviation between the feedback clocks fck and fckb reach a specific value), the speed for generating signals creg and cregb by the help of the phase detection apparatus 50 is fast. That is, by the help of the phase detection apparatus 50, the codes of the signals which make the duty cycles of the second internal clocks clk2 can be found and recorded. After the digital codes are found and recorded, the phase detection apparatus 50 is inactivated.

Next, implementation details of the phase detection apparatus 50 are illustrated. The phase detection apparatus 50 comprises a second duty cycle corrector 501, a phase detector 502, and a second switch SW2, wherein the second duty cycle corrector 501 is electrically connected to the phase detector 502, and the phase detector 502 is electrically connected to the duty cycle corrector 51, and is electrically connected to the counter 55 via the second switch SW2.

The second duty cycle corrector 501 is used to receive the external clocks xclk and xclkn, and generate the second internal clocks clk2 and clkn2 according to the external clocks xclk and xclkn. The phase detector 502 receives the reference clock Ref_clk and the second internal clock clk2, and compares the phases of the reference clock Ref_clk and the second internal clock clk2 to generate the phase detection signal. The second switch SW2 is turned on to be conductive while the duty cycle of the first internal clock Ref_clk is adjusted to equal to the specific cycle, and is turned off to be non-conductive while the duty cycle of the second internal clock clk2 is adjusted to equal to the specific duty cycle.

Figure 6:
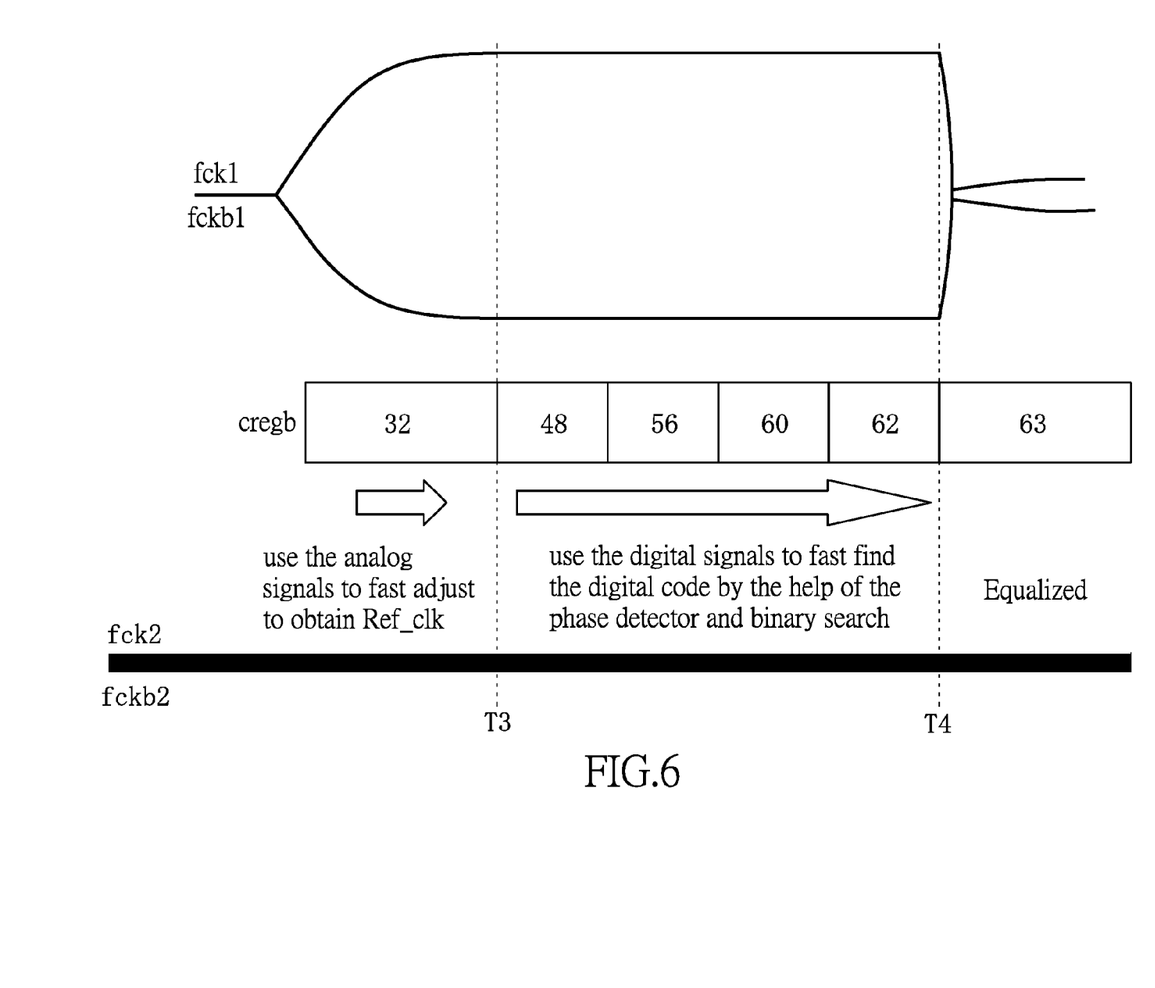
FIG. 6 is a schematic diagram which duty cycle correction apparatus adjusts the duty cycle of the second internal clocks to equal to the specific duty cycles.

Referring to FIG. 5 and FIG. 6, FIG. 6 is a schematic diagram which duty cycle correction apparatus adjusts the duty cycle of the second internal clocks to equal to the specific duty cycles. Firstly, before time T3, the second switch SW2 remains conductive, the first switch SW1 is turned off to be non-conductive, and the first duty cycle corrector adjust the duty cycles of the first internal clocks Ref_clk and clkn merely according to the feedback clocks fck1 and fckb1. After the duty cycle of the first internal clock Ref_clk is adjusted to equal to the specific duty cycle, the digital-analog converter 54 generates the signal creg (or cregb) with the default code being 32 and its complementary signal cregb (or creg), the second switch SW2 remains conductive, and the switch SW1 is turned off to be non-conductive.

In the exemplary embodiment, by the help of the binary search, the number of the phase comparisons performed by the phase detector 502 for comparing the phases of the reference clock Ref_clk and the second internal clock clk2 can be reduced. During time T3 and T4, the signals creg (or cregb) with the codes being 48, 56, 60, and 62 and their complementary signals cregb (or creg) are used to sequentially adjust the duty cycles of the second internal clocks clk2 and clkn2. The example of FIG. 6 is a worst case, the duty cycles of the second internal clocks clk2 and clkn2 are adjusted to equal to the specific duty cycles until the signal creg (or cregb) with the digital code being 63 and its complementary signal cregb (or creg) are used to adjust the duty cycles of the second internal clocks clk2 and clkn2. Next, after time T4, the second switch SW2 is turned off (i.e. the phase detection apparatus 52 is inactivated), and next the first switch SW1 is turned on and the third switch SW3 is turned on for equalizing the feedback clocks fck1 and fckb1 in a clock cycle, and the first duty cycle corrector 51 uses the feedback clocks fck1 and fckb1 to adjust the duty cycle of the first internal clocks clk and clkn in real time.

Assuming double data rate 1 synchronous dynamic random access memory (DDR1 SDRAM) is used to access the signals creg and cregb, each consuming time that the signals creg and cregb are used to adjust the second internal clocks clk2 and clkn2 is about 2 system clocks (tcks), and thus in the condition of FIG. 6, it cost 32+4*2+1=41 system clocks (41 tcks) to obtain the digital codes which make the duty cycles of the second internal clocks clk2 and clkn2 equal to the specific duty cycles.

According to the above descriptions, an exemplary embodiment of the present disclosure provides a duty cycle correction apparatus which can fast adjust the internal clocks to have the specific duty cycles.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A duty cycle correction apparatus, comprising:
    a first duty cycle corrector, receiving complementary external clocks to generate complementary first internal clocks;
    a pump circuit, electrically connected to the first duty cycle corrector, receiving the first internal clocks to generate complementary feedback clocks to the first duty cycle corrector to adjust duty cycles of the first internal clocks;
    a phase detection apparatus, electrically connected to the first duty cycle corrector, being activated while the duty cycle of the first internal clock is adjusted to a specific duty cycle, receiving the external clocks to generate complementary second internal clocks, selecting the first internal clock as a reference clock, and comparing phases of the second internal clock and the reference clock to generate a phase detection signal;
    a comparator, electrically connected to the pump circuit for receiving the feedback clocks to generate a comparison signal;
    a counter, electrically connected to the comparator through a first switch for receiving the comparison signal and the phase detection apparatus through a second switch for receiving the phase detection signal, to generate complementary digital signals; and
    a digital-analog converter, electrically connected to the counter, for receiving the complementary digital signals to generate complementary signals to the phase detection apparatus to adjust duty cycles of the second internal clocks;
    wherein the duty cycle correction apparatus records codes of the complementary signals which make the duty cycle of the second internal clock equal to the specific duty cycle, and after the codes are recorded, the phase detection apparatus is inactivated.

2. The duty cycle correction apparatus according to claim 1, wherein the specific duty cycle is substantially 50%/50%.

3. The duty cycle correction apparatus according to claim 1, further comprising:
    a first capacitor, two ends thereof are electrically connected the pump circuit and a grounding end;
    a second capacitor, two ends thereof are electrically connected the pump circuit and a grounding end.

4. The duty cycle correction apparatus according to claim 1, wherein the first switch is turned on while the codes which make the duty cycle of the second internal clock equal to the specific duty cycle are recorded, the comparator receives the feedback clocks to generate the comparison signal to the counter, but the first duty cycle corrector adjusts the duty cycles of the first internal clocks merely according to the feedback clocks and the codes;
    wherein the second switch is turned off while the codes are recorded.

5. The duty cycle correction apparatus according to claim 1, wherein the duty cycle of the first internal clock is adjusted to equal to the specific duty cycle, but the first duty cycle corrector adjusts the duty cycles of the first internal clocks merely according to the feedback clocks.

6. The duty cycle correction apparatus according to claim 1, wherein the phase detection apparatus comprises:
    a second duty cycle corrector, receiving the external clocks to generate the second internal clocks; and
    a phase detector, electrically connected to the first duty cycle corrector, the second duty cycle corrector, and the counter, comparing the phases of the second internal clock and the reference clock.

7. The duty cycle correction apparatus according to claim 1, wherein a binary search is utilized to reduce comparison number of phase comparisons of the reference clock and the second internal clock.

8. The duty cycle correction apparatus according to claim 1, wherein a phase comparison of the reference clock and the second internal clock is to compare rising edge positions of the reference clock and the second internal clock.

9. The duty cycle correction apparatus according to claim 1, further comprising a third switch, coupled between the feedback clocks for equalizing the feedback clocks in a clock cycle.

* * * * *